(12) United States Patent
Konishi et al.

(10) Patent No.: US 11,454,664 B2
(45) Date of Patent: Sep. 27, 2022

(54) TESTING SYSTEM

(71) Applicant: TOKYO ELECTRON LIMITED, Tokyo (JP)

(72) Inventors: Kentaro Konishi, Nirasaki (JP); Jun Fujihara, Nirasaki (JP); Hiroki Shikagawa, Nirasaki (JP); Hiroshi Yamada, Nirasaki (JP); Yukinori Murata, Nirasaki (JP); Katsuaki Sugiyama, Nirasaki (JP); Shin Uchida, Nirasaki (JP); Tetsuya Kagami, Nirasaki (JP); Hiroaki Hayashi, Nirasaki (JP); Rika Ozawa, Nirasaki (JP); Takanori Hyakudomi, Nirasaki (JP); Xingjun Jiang, Nirasaki (JP); Kenichi Narikawa, Nirasaki (JP); Tomoya Endo, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 145 days.

(21) Appl. No.: 16/625,536

(22) PCT Filed: Apr. 16, 2018

(86) PCT No.: PCT/JP2018/015732
§ 371 (c)(1),
(2) Date: Dec. 20, 2019

(87) PCT Pub. No.: WO2018/235411
PCT Pub. Date: Dec. 27, 2018

(65) Prior Publication Data
US 2021/0333319 A1    Oct. 28, 2021

(30) Foreign Application Priority Data

Jun. 21, 2017 (JP) .............................. JP2017-121284
Dec. 19, 2017 (JP) .............................. JP2017-242530

(51) Int. Cl.
*G01R 31/28* (2006.01)

(52) U.S. Cl.
CPC ..... *G01R 31/2867* (2013.01); *G01R 31/2868* (2013.01); *G01R 31/2877* (2013.01); *G01R 31/2881* (2013.01); *G01R 31/2887* (2013.01)

(58) Field of Classification Search
CPC ............ G01R 31/2867; G01R 31/2868; G01R 31/2877; G01R 31/2881; G01R 31/2887;
(Continued)

(56) References Cited

U.S. PATENT DOCUMENTS

| 6,208,510 B1* | 3/2001 | Trudeau ............. H05K 7/20609 |
| | | 165/80.3 |
| 8,726,748 B2* | 5/2014 | Obikane ............ G01R 31/2893 |
| | | 73/866.5 |

(Continued)

FOREIGN PATENT DOCUMENTS

| JP | 2007-101345 A | 4/2007 |
| JP | 2009-64830 A | 3/2009 |

(Continued)

*Primary Examiner* — Vinh P Nguyen
(74) *Attorney, Agent, or Firm* — Nath, Goldberg & Meyer; Jerald L. Meyer; Tanya E. Harkins

(57) ABSTRACT

A testing system includes: an inspection module including a plurality of levels of inspection chambers in each of which a tester part having a tester configured to perform an electrical inspection of an inspection object and a probe card is accommodated; an aligner module configured to align the inspection object with the tester part; an alignment area in which the aligner module is accommodated; and a loader part configured to load the inspection object into the alignment area and unload the inspection object out of the aligner module, wherein the inspection module is located adjacent to the alignment area.

20 Claims, 12 Drawing Sheets

(58) Field of Classification Search
CPC ......... H01L 21/67167; H01L 21/67173; H01L 21/67178
See application file for complete search history.

(56) References Cited

U.S. PATENT DOCUMENTS

| | | | | |
|---|---|---|---|---|
| 8,975,904 | B2* | 3/2015 | Yamada | G01R 31/2887 |
| | | | | 324/750.16 |
| 9,863,977 | B2* | 1/2018 | Furuya | G01R 31/2887 |
| 11,067,624 | B2* | 7/2021 | Konishi | G01R 1/06794 |
| 11,175,309 | B2* | 11/2021 | McCloud | G01R 1/0408 |

FOREIGN PATENT DOCUMENTS

| | | |
|---|---|---|
| JP | 2011-100883 A | 5/2011 |
| JP | 2014-29917 A | 2/2014 |
| JP | 2014-179379 A | 9/2014 |
| JP | 2014-192218 A | 10/2014 |

* cited by examiner

TESTING SYSTEM

This is a National Phase Application filed under 35 U.S.C. 371 as a national stage of PCT/JP2018/015732, filed Apr. 16, 2018, an application claiming the benefit of Japanese Application No. 2017-121284, filed Jun. 21, 2017 and Japanese Application No. 2017-242530, filed Dec. 19, 2017, the content of each of which is hereby incorporated by reference in their entirety.

TECHNICAL FIELD

The present disclosure relates to a testing system.

BACKGROUND

In a semiconductor device manufacturing process, an electrical inspection of multiple semiconductor elements (devices) formed on a semiconductor wafer (hereinafter, simply referred to as a "wafer"), which is a substrate, is performed after all the processes on the wafer are completed. An apparatus for performing the electrical inspection generally includes a probe part having a wafer stage, a probe card having probes that come into contact with the device, an aligner configured to align the wafer, and the like, and a tester configured to apply an electrical signal to the device and inspect the various electrical characteristics of the device.

In order to efficiently perform the electrical inspection on a large number of wafers, a testing system is used, in which a plurality of cells, each including a prober part that includes, for example, a probe card and a chuck plate configured to hold a wafer, and a test head configured to accommodate the tester, are arranged in the horizontal direction and the height direction (e.g., Patent Document 1). Patent Document 1 exemplifies a testing system, which includes four cells in the horizontal direction and three cells in the height direction. Moreover, in each cell, the test head is mounted on the prober part.

PRIOR ART DOCUMENT

Patent Document

Patent Document 1: Japanese Laid-Open Patent Publication No. 2014-179379

SUMMARY

The present disclosure provides a testing system that is capable of increasing the mounting density of testers.

A testing system according to an embodiment of the present disclosure includes: an inspection module including a plurality of levels of inspection chambers in each of which a tester part having a tester configured to perform an electrical inspection of an inspection object and a probe card is accommodated; an aligner module configured to align the inspection object with the tester part; an alignment area in which the aligner module is accommodated; and a loader part configured to load an inspection object into the aligner module and unload the inspection object out of the aligner module, wherein the inspection module is located adjacent to the alignment area.

According to the present disclosure, a testing system that is capable of increasing the mounting density of testers is provided.

DETAILED DESCRIPTION

Hereinafter, exemplary embodiments will be described in detail with reference to the accompanying drawings.

First Embodiment

First, a first embodiment will be described.

Figure 1:
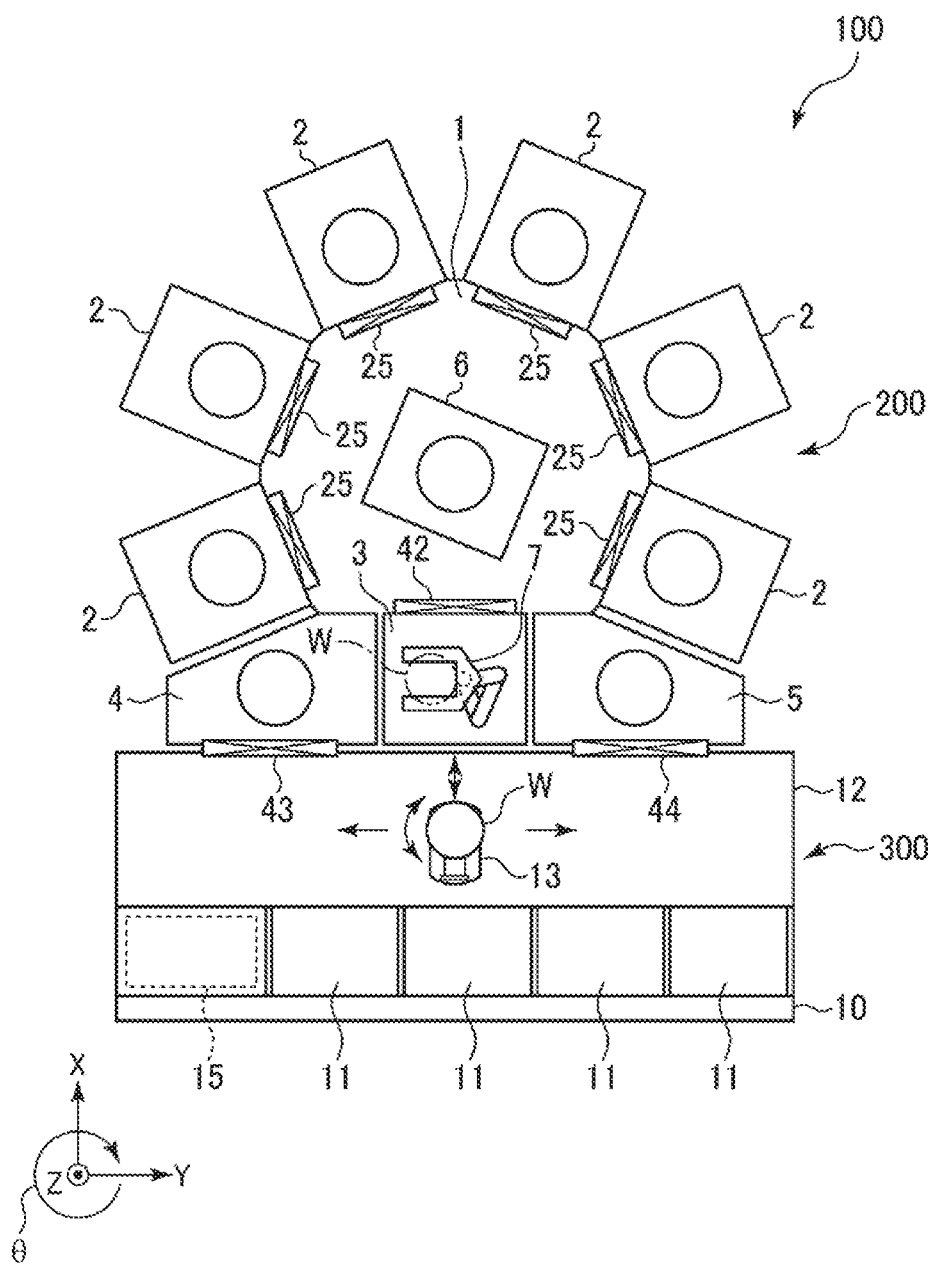
FIG. 1 is a plan view illustrating the schematic configuration of a testing system according to a first embodiment.
Figure 2:
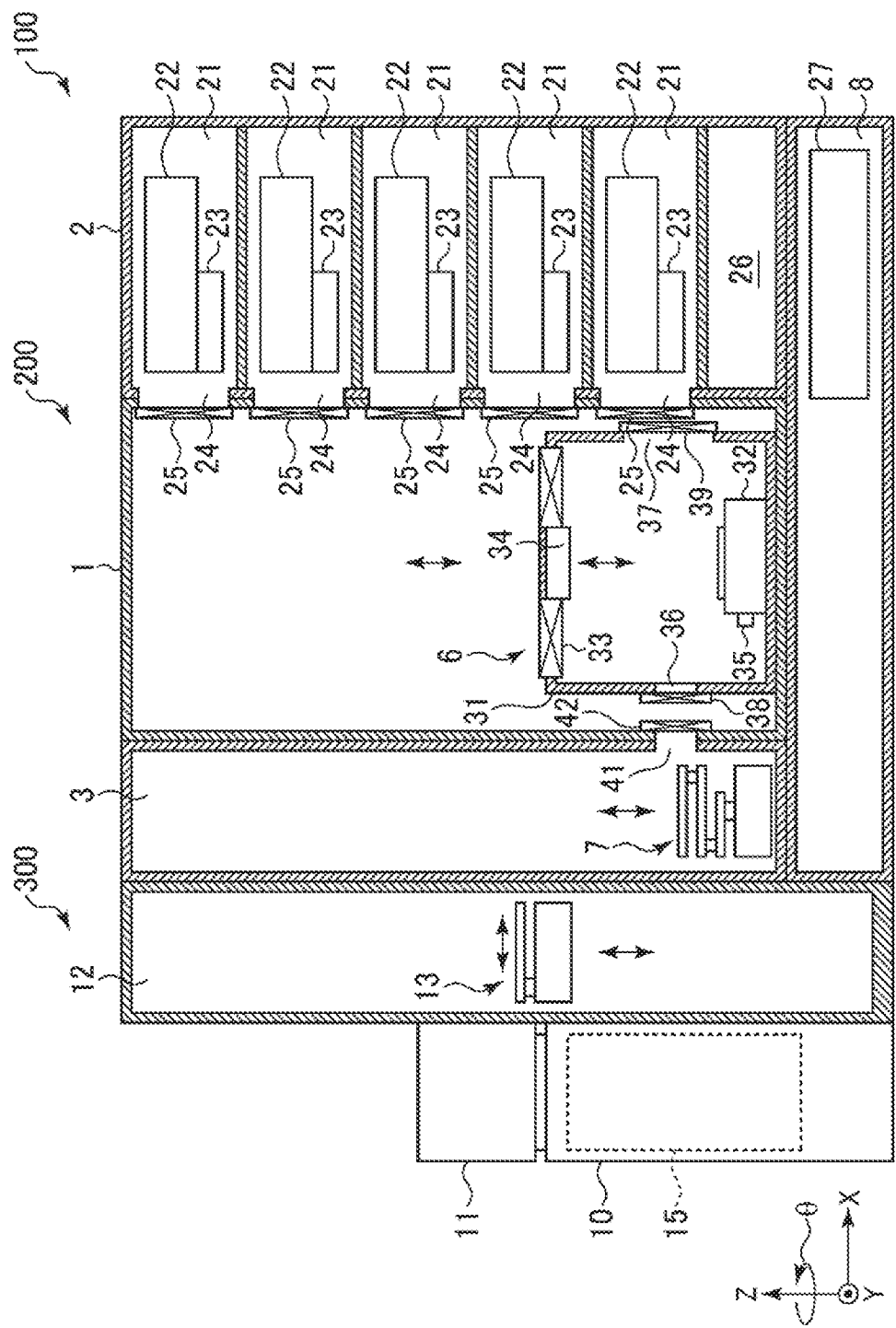
FIG. 2 is a vertical cross-sectional view illustrating the testing system of FIG. 1.

FIG. 1 is a plan view illustrating the schematic configuration of a testing system according to a first embodiment, and FIG. 2 is a vertical cross-sectional view illustrating the testing system of FIG. 1.

The testing system 100 of the present embodiment inspects electrical characteristics of a device formed on a wafer that is an inspection object, and is configured to enable an inspection at a low temperature of about −40 to −20 degrees C.

The testing system 100 includes an inspection part 200 configured to inspect a wafer W and a loader part 300 configured to load/unload a wafer.

The inspection part 200 includes an aligner module 6, an alignment area 1, and a plurality of (six in the present example) inspection modules 2. The aligner module 6 is used for aligning a wafer and a tester, and is accommodated in the alignment area 1. The alignment area 1 has a polygonal shape in a plan view, and the plurality of inspection modules 2 are provided around the alignment area 1 so as to have a radially clustered shape.

The loader part 300 includes a placement table 10, a loader module 12, a transport part 3, a buffer part 4, a pre-alignment part 5, and a controller 15. The placement table 10 is configured to place thereon a FOUP 11, which is a container configured to store a plurality of wafers W, and has a load port. The loader module 12 has a loader 13 configured to transport a wafer or the like. The transport part 3 includes a transport mechanism 7 configured to transport a wafer W. The buffer part 4 is configured to temporarily place a wafer W thereon. The pre-alignment part 5 performs pre-alignment of a wafer W. The controller 15 is provided inside the placement table 10.

In addition, a chiller area 8 is provided below the alignment area 1, the inspection module 2, and the transport part 3.

The inspection part 200 is adjusted to a dry atmosphere, which is an environment suitable for inspection, in order to prevent dew condensation during inspection in low temperature. The dry atmosphere may be formed by supplying dry air. In addition, in the loader part 300, the transport part 3, the buffer part 4, and the pre-alignment part 5 are also adjusted to a dry atmosphere. The other parts in the loader part 300 is in an ambient air atmosphere.

Each of the inspection modules 2 has a plurality of levels (in the present example, five levels) of inspection chambers 21, and an electrical component accommodation part 26 is provided below a lowermost inspection chamber 21. A chiller unit 27 is provided under the inspection module 2 in the chiller area 8 below the electrical component accommodation part 26. Instead of providing the electrical component accommodation part 26, an inspection chamber 21 may be provided so as to further increase the number of levels of the inspection chambers 21.

Each of the inspection chambers 21 accommodates a tester part 22 having a contact mechanism including a tester and a probe card. The inspection is performed in a state in which a chuck top 23, on which a wafer is mounted, is adsorbed to a contact portion of the tester part 22. An opening 24 is provided between each of the inspection chambers 21 and the alignment area 1, and the opening 24 is configured to be opened and closed by a shutter 25. The tester part 22 and the chuck top 23 are configured to be individually pulled out to the alignment area 1 by a movement mechanism (not illustrated). Details of shutters 25 and tester parts 22 will be described below.

A rear side of each of the inspection chambers 21 is a maintenance area, and is configured to perform maintenance of a tester part 22 by pulling the tester part 22 into the maintenance area.

The transport mechanism 7 in the transport part 3 may have, for example, an articulated structure as illustrated, and the transport mechanism 7 is provided so as to be capable of moving up and down in the space within the transport part 3. An opening 41 connected to the alignment area 1 is provided in a lower side of the transport part 3, and the opening 41 is configured to be opened and closed by a shutter 42. Then, a wafer W is loaded/unloaded through the opening 41 with respect to the alignment area 1 by the transport mechanism 7. The transport mechanism 7 delivers a wafer W to the buffer part 4 and the pre-alignment part 5 at a position above the opening 41.

The aligner module 6 includes a housing 31, an aligner 32, a fan filter unit (FFU) 33, an upper camera 34, and a lower camera 35. The housing 31 is provided so as to be movable up and down in a Z direction and rotatable in a θ direction around a Z axis. The aligner 32 is provided at a bottom of the housing 31. The FFU 33 is provided on an upper surface of the housing 31. The upper camera 34 is provided in a center of the upper surface of the housing 31 so as to be movable up and down. The lower camera 35 is provided on a side surface of the aligner 32.

The housing 31 may be raised and lowered by, for example, a ball screw mechanism. A downflow of clean dry air is supplied from the FFU 33. In addition, a side surface of the housing 31 has an opening 36 for loading/unloading a wafer W by the transport mechanism 7 of the transport part 3 and an opening 37 for carrying in/out the tester part 22 and the chuck top 23. The openings 36 and 37 are configured to be opened and closed by respective shutters 38 and 39. When a wafer W is loaded/unloaded, the aligner module 6 is moved such that the opening 36 is aligned with the opening 41 in the transport part 3. In addition, when the tester part 22 and/or the chuck top 23 are carried in/out, the aligner module 6 is moved such that the opening 37 is aligned with the opening 24 of a corresponding inspection chamber of the inspection modules 2.

The loader 13 is provided to be movable in a space within the loader module 12 in an X direction, a Y direction, a Z direction, and a θ direction around the Z axis in drawings. As a result, the loader 13 receives wafers W in the FOUP 11 via the load port and transports the wafers W to the buffer part 4 or the pre-alignment part 5, or returns inspected wafers W, which are transported to the buffer part 4, to the FOUP. A transport opening in the buffer part 4 and a transport opening in the pre-alignment part 5 are configured to be opened and closed by respective shutters 43 and 44.

An ambient air atmosphere and a dry atmosphere are partitioned by the shutters 43 and 44. In addition, by providing a shutter 42 between the transport part 3 and the alignment area 1, an infiltration of air into the alignment area 1 and the inspection module 2 where it is actually desired to prevent dew condensation is reliably prevented. In addition, the plurality of inspection chambers 21 are partitioned, and it is possible to control each of the inspection chambers 21 to a desired dry atmosphere by closing the shutter 25 of each of the inspection chambers 21. The shutter 25 also has a function of preventing the infiltration of air from the inspection chamber 21 in which maintenance is performed. In addition, an atmosphere control of respective inspection chambers 21 may be performed integrally.

Next, the tester part 22 and the chuck top 23 will be described.

Figure 3:
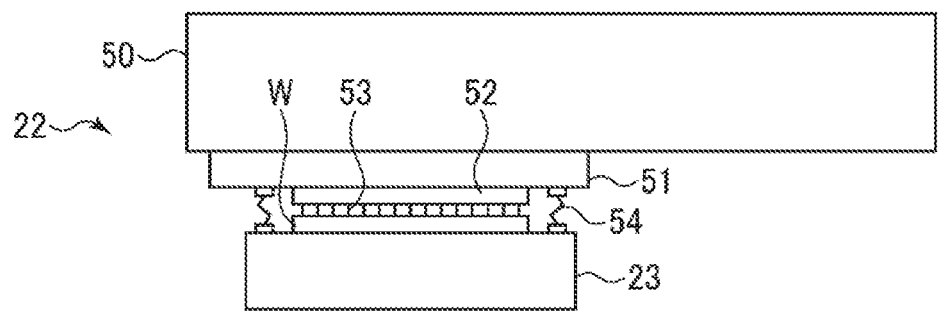
FIG. 3 is a view showing the states of a tester part and a chuck top when an electrical inspection is performed on a device formed on a wafer in an inspection chamber.

FIG. 3 is a view illustrating a state of the tester part 22 and the chuck top 23 when the electrical inspection is performed on a device formed on a wafer W in the inspection chamber 21.

The tester part 22 includes a tester 50, a probe card 52, an interface part 51, and a bellows 54. The tester 50 performs the electrical inspection on a plurality of devices formed on a wafer W. The tester 50 is configured such that a plurality of tester module boards (not illustrated) configured to perform power supply, waveform input (driver), waveform measurement (comparator), voltage and current output, and measurement with respect to devices on a wafer W are provided in a housing of the tester 50. The probe card 52 has a large number of contact probes 53 configured to come into contact with the electrodes of devices formed on a wafer W. The interface part 51 is formed between the tester 50 and the probe card 52. The bellows 54 forms a sealed space for vacuum-adsorbing the chuck top 23, which holds a wafer W, to the tester part 22.

A wafer W is adsorbed to and is held on a surface of the chuck top 23, and the chuck top 23 has a temperature control mechanism therein. When the inspection at a low temperature is performed, a chiller (cooling liquid) is supplied from the chiller unit 27 so as to control a temperature of the chuck top 23. In addition, to enable the inspection at a high temperature, a heater as a temperature control mechanism is also provided in the chuck top 23.

The chuck top 23 is adsorbed to the tester part 22 when the sealed space in the bellows 54 is evacuated, and the contact probes 53 come into contact with a wafer W. In this state, an electrical signal from the tester 50 is sent to each device on the wafer W via the interface part 51 and the probe card 52, and a response signal from each device on the wafer W returns to the tester 50 via the probe card 52 and the interface part 51. In this manner, the electrical characteristics of the devices are inspected.

The controller 15 includes a main controller having a CPU (computer), an input device (a keyboard or a mouse), an output device (a printer), and a display device (a display), and a storage device (storage medium) so as to control respective components constituting the testing system 100. The respective components to be controlled may include, for example, the tester 50 in each of the inspection chambers 21, a vacuum adsorption mechanism, the aligner module 6, the transport mechanism 7, the loader 13, the tester part 22, the movement mechanism of the chuck top 23, and the aligner 32. The main controller of the controller 15 causes the testing system 100 to perform a predetermined operation on the basis of, for example, a processing recipe stored in the storage medium built in the storage device or the storage medium set in the storage device.

Figure 4:
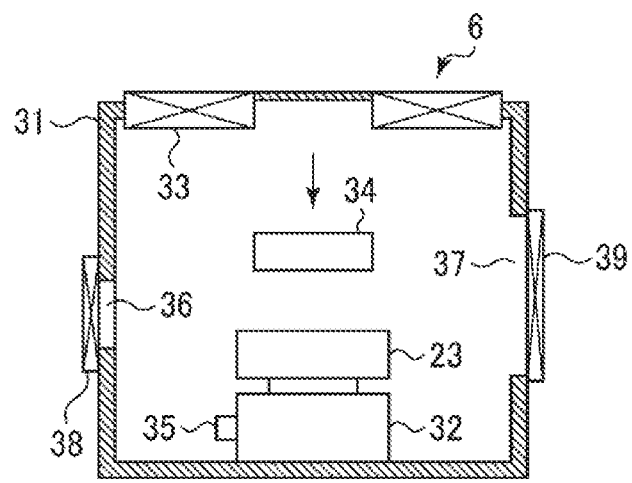
FIG. 4 is a view for explaining a procedure when transporting a wafer to a tester part.

A wafer W is transported to the tester part 22, as illustrated in FIG. 4, in a state in which the chuck top 23 is carried into the alignment area 1 and placed and adsorbed on the aligner 32. An alignment at this time is performed by the upper camera 34 of a lowered state.

Figure 5:
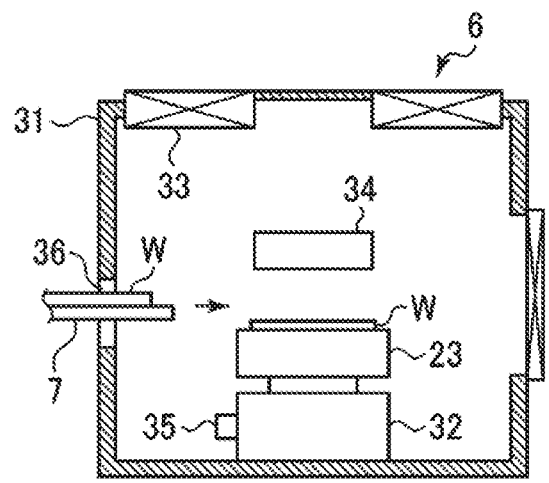
FIG. 5 is a view for explaining a procedure when transporting a wafer to a tester part.

Then, as illustrated in FIG. 5, a wafer W is loaded into the housing 31 of the aligner module 6 from the opening 36 by the transport mechanism 7, and is placed on the chuck top 23 at a predetermined position so as to be adsorbed.

Figure 6:
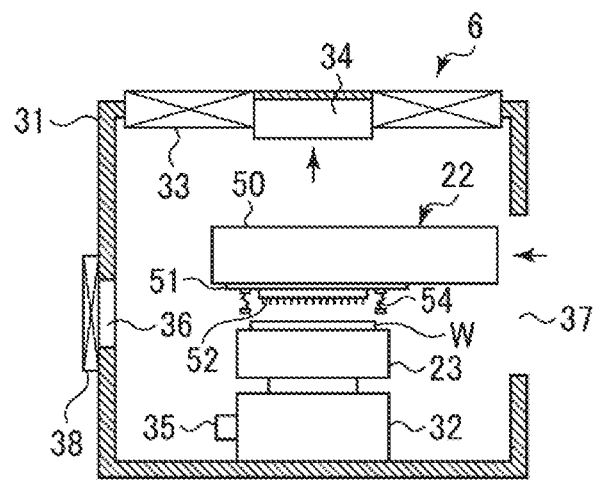
FIG. 6 is a view for explaining a procedure when transporting a wafer to a tester part.

Next, as illustrated in FIG. 6, the upper camera 34 is returned, the tester part 22 is carried into the housing 31 of the aligner module 6 from the opening 37, and the tester part 22 is aligned by the lower camera 35.

Figure 7:
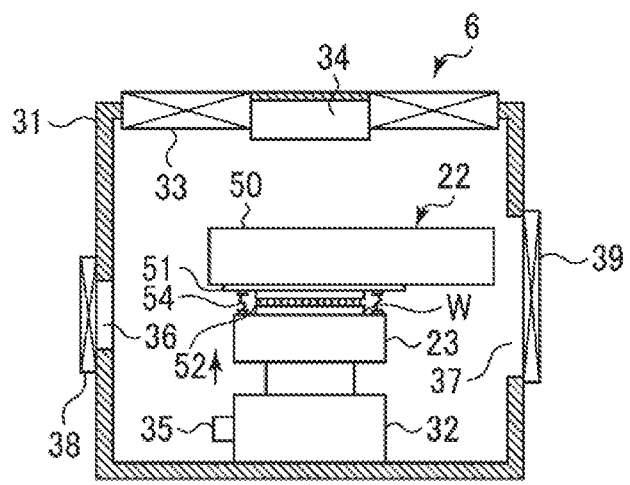
FIG. 7 is a view for explaining a procedure when transporting a wafer to a tester part.

Next, as illustrated in FIG. 7, the chuck top 23 is raised by a Z block of the aligner 32, the contact probes of the probe card 52 of the tester part 22 are brought into contact with the wafer, and then the chuck top 23 is raised so as to press the contact probes against the wafer. In this state, the space surrounded by the bellows 54 is evacuated so that the chuck top 23 is adsorbed to the tester part 22, and a state in which the wafer W is pressed against the contact probes is maintained. At this time, the housing 31 has functions of supporting the tester part 22 via a predetermined member and preventing a pressing force against the wafer W from being relieved.

Figure 8:
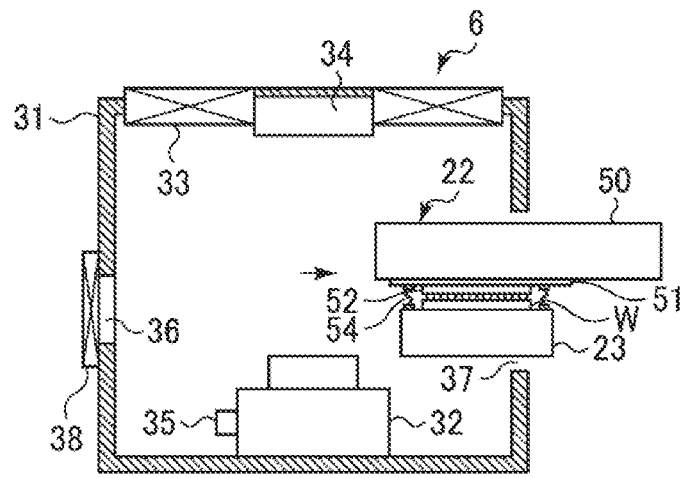
FIG. 8 is a view for explaining a procedure when transporting a wafer to a tester part.

Next, as illustrated in FIG. 8, the adsorption of the aligner 32 and the chuck top 23 is released, the tester part 22 and the chuck top 23 adsorbed thereto are moved to the inspection chamber 21, and the inspection of the wafer W is started.

When the inspection of the wafer W is terminated, the wafer W is unloaded by an operation that reverses the operation performed when the wafer W is loaded. That is, the tester part of the inspection chamber 21 in which the inspected wafer W exists and the chuck top 23 adsorbed thereto are moved from the inspection chamber 21 into the housing 31 of the aligner module 6, in an opposite manner to FIG. 8. Next, the chuck top 23 is placed on and adsorbed to the aligner 32 so as to obtain the state illustrated in FIG. 7. In this state, the vacuum in the space surrounded by the bellows 54 is released and the adsorption of the chuck top 23 is released so that the state illustrated in FIG. 6 is obtained. Next, the tester part 22 is retracted to the inspection chamber 21, and the wafer W on the chuck top 23 is unloaded by the transport mechanism 7 through the opening 36.

Then, a next uninspected wafer W is placed on the chuck top 23 in the state illustrated in FIG. 4, the chuck top 23, to which the wafer W is adsorbed, is returned to the inspection chamber 21 in the state in which the chuck top 23 is adsorbed to the tester part 22 in the procedure of FIGS. 5 to 8, and the new wafer W is inspected.

Next, a cooling mechanism of the tester 50 will be described.

Since a plurality of tester module boards constituting the tester 50 of the tester part 22 generate heat, it is necessary to cool the tester 50 (the tester module boards). For this reason, conventionally, a cooling plate is attached to a tester module board via a heat conductive sheet, and cooling water is circulated and supplied from a chiller unit to an inside of the cooling plate via a cooling water tube. The tester 50 is cooled by heat-exchanging with cooling water and cooling the heated cooling water with a chiller unit (a heat exchanger). However, in a case in which the tester 50 moves as the present embodiment, it is necessary to move the cooling water tube together with the tester 50, and thus a disposition of the cooling water tube becomes complicated.

Figure 9:
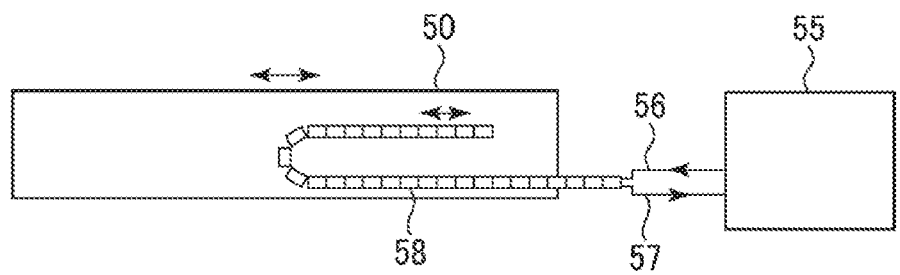
FIG. 9 is a view illustrating an example of a cooling mechanism for a tester.

As a cooling structure of the tester 50 for avoiding this, one illustrated by FIG. 9 may be referred. In the cooling structure, cooling water tubes 56 and 57, which are configured to circulate and supply cooling water from the chiller unit 55 to the plurality of tester module boards in the tester 50 in the inspection chamber 21, may be accommodated in an articulated cable duct 58 together with a vacuum line and a power supply cable. When using this manner, even if the tester 50 moves, the disposition is not complicated since the cooling water tubes 56 and 57 are located in the articulated cable duct 58. In addition, it is of course possible to avoid a complexity of a disposition of the vacuum line and the power supply cable.

Figure 10:
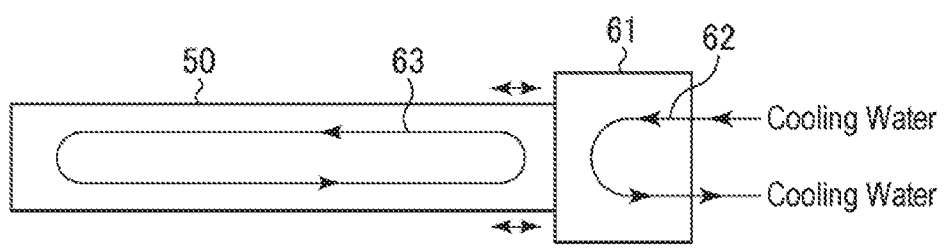
FIG. 10 is a view illustrating another example of a cooling mechanism for a tester.

When it is still insufficient with FIG. 9, a cooling mechanism illustrated in FIG. 10 may be used as another cooling mechanism. In the cooling mechanism of FIG. 10, a cooling member 61 provided with a cooling water flow path 62 is disposed on a rear side of the tester 50 in the inspection chamber 21, and cooling water is circulated and supplied from the chiller unit to the cooling water path 62 through the cooling water tube. In addition, the tester 50 is configured to be brought into contact with and separated from the cooling member 61, so that the tester 50 is brought into contact with the cooling member 61 and is cooled by heat transfer during the inspection. The tester 50 is separated from the cooling member 61 during the alignment. When an inside of the tester 50 is moved to the aligner module 6, since a necessity for cooling is lower than that at a time of the inspection, cooling water may be internally circulated in the cooling water flow path 63 within the tester 50.

Figure 11A:
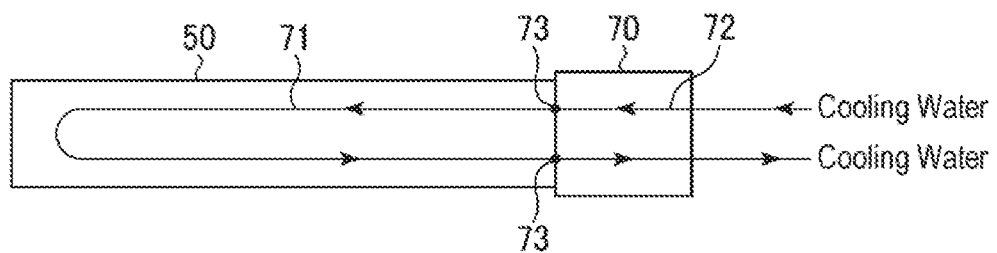
FIG. 11A is a view illustrating still another example of a cooling mechanism for a tester.

As another example of the cooling mechanism, as illustrated in FIG. 11A, a cooling mechanism, in which a cooling member 70 having two cooling water flow paths 72 formed therein and couplers 73 provided at connection ends of respective cooling water flow paths 72 is disposed, may be used on a rear side of the tester 50 within the inspection chamber 21. In the the present example, cooling water is supplied from the chiller unit to the cooling water flow path 72 through the cooling water tube. In addition, the tester 50 is configured to be brought into contact with and separated from the cooling member 70, so that during the inspection, the tester 50 is connected to the cooling member 70 and the cooling water flow path 71 inside the tester 50 and the cooling water flow path 72 of the cooling member 70 are connected to the couplers 73 so as to make cooling water circulate. In this manner, sufficient cooling can be ensured during the inspection, and, as illustrated in FIG. 11B, the tester 50 may be separated from the cooling member 70 while making it possible for the cooling water to be circulated in the cooling water flow path 71 of the tester 50 during the alignment where the cooling requirement is smaller than that during the inspection.

Figure 11B:
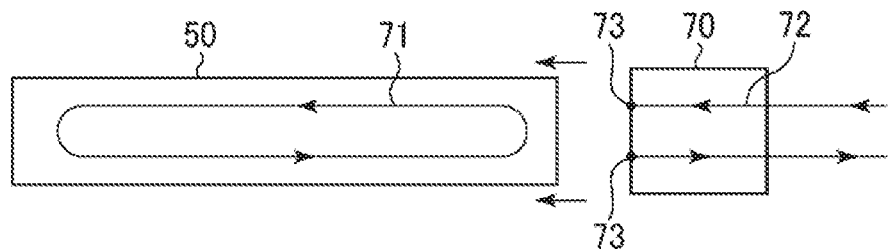
FIG. 11B is a view illustrating a state in which the tester is separated from a cooling member in the cooling mechanism of FIG. 11A.

In the case of FIGS. 10, 11A, and 11B, during the maintenance of the tester part 22, the cooling member 61 and the cooling member 70 may be opened and the tester part 22 may be pulled out to the maintenance area.

Figure 12A:
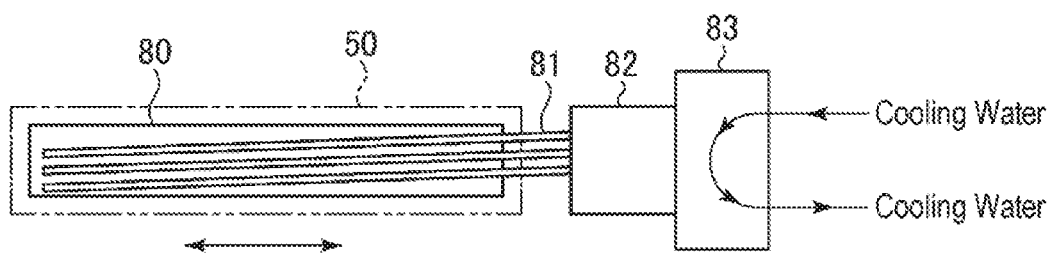
FIG. 12A is a side view illustrating another example of a cooling mechanism for a tester.
Figure 12B:
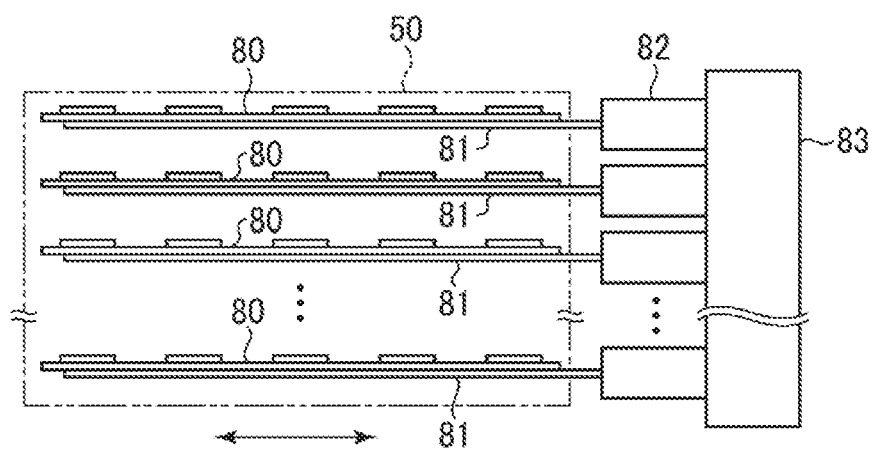
FIG. 12B is a plan view illustrating another example of a cooling mechanism for a tester.

As another example of the cooling mechanism, it is also effective to perform cooling using a heat pipe as illustrated in FIGS. 12A and 12B. FIG. 12A is a side view of an inside of the tester 50 and the cooling mechanism of the present example, and FIG. 12B is a plan view thereof. In the present example, the heat pipe 81 is provided so as to be in contact with each of a plurality of tester module boards 80 in the tester 50. Three heat pipes 81 are provided for one tester module board 80. However, the number of heat pipes 81 is not limited. A base end of the heat pipe 81 in each of the tester module boards 80 is inserted into a tester-side cooling member 82, and, as illustrated in FIG. 12B, a plurality of tester-side cooling members 82 are arranged side by side to correspond to the plurality of tester module boards 81. The plurality of tester-side cooling members 82 are provided so as to be capable of being brought into contact with and separated from the cooling member 83. A cooling water flow path is provided in the cooling member 83, and cooling is performed by circulating and supplying cooling water from the chiller unit through the cooling water tube.

In the present example, when the inspection is performed using the tester 50, the tester-side cooling members 82 are brought into contact with the cooling member 83, and a cold thermal energy of the cooling member 83 is supplied to the tester 50 through the tester-side cooling members 82 and the heat pipes 81. More specifically, the cold thermal energy is supplied to and cools each of the tester module boards 80 in the tester 50. During the alignment, the tester 50 is separated from the cooling member 83 together with the tester-side cooling members 82. When the inside of the tester 50 is moved to the aligner module 6, a need for cooling is lower than during the inspection, and therefore the cold thermal energy of the tester-side cooling members 82 may be transferred to the tester 50 via the heat pipes 81.

Each of the heat pipes 81 is made of a cylindrical metal (e.g., copper or copper alloy) closed at both ends thereof, and has a sealed structure filled with a working fluid such as water. In addition, the heat pipe 81 has a function of easily transporting a large amount of heat from one end to the other end using evaporation and dew condensation phenomena of the working fluid filled, and a function of creating uniform temperature by rapidly transporting heat when the temperature is uneven. Heat pipes 81 are disposed obliquely such that the working fluid flows down to tip ends. With the function of the heat pipes 81, the cold thermal energy of the cooling member 83 is transferred to the tester 50 (the tester module boards 80) via the tester-side cooling members 82 and the heat pipes 81. Therefore, it is possible to cool the tester 50 (the tester module boards 80) with a simple structure that does not use, for example, the cooling water tube or the cooling water flow path.

In the present example, when the maintenance of the tester part 22 is performed, the cooling member 83 may be opened, and the tester part 22 may be pulled out to the maintenance area for each heat pipes 81 and each tester-side cooling member 82, and then the heat pipe 81 and the tester-side cooling member 82 may be separated from each other.

In the above description of the cooling of the tester module boards in the tester 50, it has been described on the assumption that the tester module boards are cooled with cooling water, but other cooling liquids may be used.

As the chiller unit (a heat exchanger) for cooling the tester module boards constituting a tester, a chiller unit dedicated to the tester has been conventionally used, and in the present embodiment, a chiller unit dedicated to the tester may also be used. However, in this case, a footprint of the testing system is increased by the chiller unit, and electric power needed for exchanging heat of cooling water and the like is required in the chiller unit dedicated to the tester.

As a cooling manner capable of solving the problem of increased footprint and the problem of electric power when using the chiller unit dedicated to the tester, one that uses a cooling liquid of a chiller unit 27 of the chuck top 23 may be used.

Figure 13:
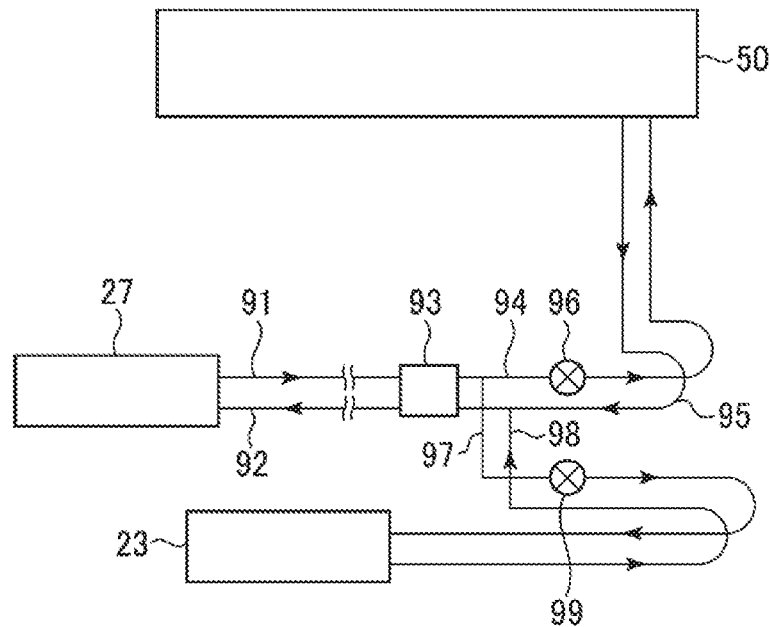
FIG. 13 is a view illustrating an example of cooling system for a tester.

FIG. 13 is a view for explaining an example of a cooling system in above case. The chiller unit 27 functions as a heat exchanger, and is connected to a cooling liquid supply pipe 91 and a cooling liquid return pipe 92, and the cooling liquid cooled to a predetermined temperature is supplied to the cooling liquid supply pipe 91. In addition, the cooling liquid, which has been supplied from the cooling liquid return pipe 92 and has been raised in temperature, is returned to the chiller unit 27. The cooling liquid supply pipe 91 and the cooling liquid return pipe 92 are connected to a relay member 93.

A tester-side cooling liquid supply path 94, which communicates with the cooling liquid supply pipe 91, and a tester-side cooling liquid return path 95, which communicates with the cooling liquid return pipe 92, are connected to the relay member 93. A valve 96 is interposed in the tester-side cooling liquid supply path 94. Since a temperature of the cooling liquid may increase or decrease depending on test temperature of a wafer and heat quantity, a temperature of the tester module in the tester 50 is controlled to be within a predetermined range by controlling a flow rate of the cooling liquid supplied to the tester 50 by the valve 96. The tester-side cooling liquid supply path 94 reaches the tester 50, branches in the tester 50, and is connected to the cooling plate attached to each of the tester module boards via the heat conductive sheet (none of which is illustrated), thereby cooling each of the tester module boards. Further, the tester-side cooling water return path 95 also reaches the tester 50, branches in the tester 50, and is connected to the cooling plate attached to each of the tester module boards via the heat conductive sheet, and thus the cooling liquid, which has been provided for cooling and has been raised in temperature, is returned to the chiller unit 27.

A chuck top-side cooling liquid supply path 97 branches from the tester-side cooling liquid supply path 94, and a chuck top-side cooling liquid return path 98 branches from the tester-side cooling liquid return path 95. A valve 99 is interposed in the chuck top-side cooling liquid supply path 97 so as to control a flow rate of the cooling liquid supplied to the chuck top 23. Since the cooling liquid is supplied to a cooling liquid flow path in the chuck top 23 through the chuck top-side cooling liquid supply path 97, the chuck top 23 is controlled to a predetermined temperature. In addition, the chuck top-side cooling liquid return path 98 is also connected to the cooling liquid flow path in the chuck top 23, and the cooling liquid heated after being used for cooling the chuck top 23 is returned toward the chiller unit 27.

As described above, by cooling a tester motherboard in the tester 50 using the chiller unit 27 of the chuck top 23, it is not necessary to provide the chiller unit dedicated to the tester. For this reason, it is possible to reduce the footprint of the testing system and to reduce an electric power for heat exchange of, for example, cooling water.

Figure 14:
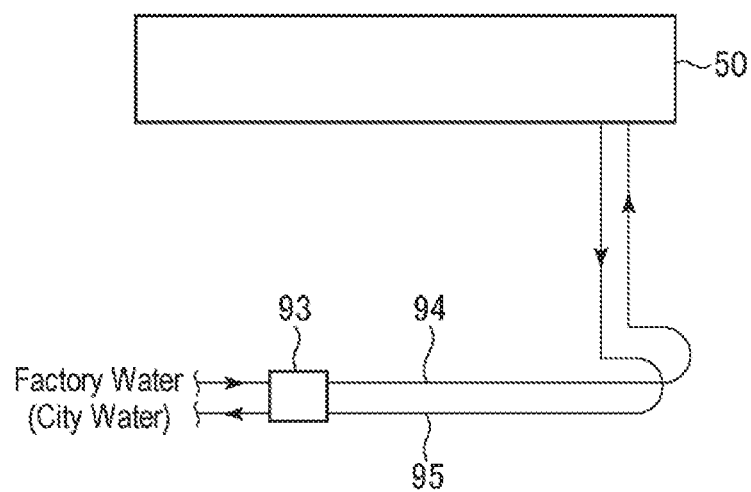
FIG. 14 is a view illustrating another example of cooling system for a tester.

In addition, as illustrated in FIG. 14, factory water (city water) used as, for example, circulating water, as a cooling liquid in the factory may be used for cooling the tester 50 (the tester module boards). However, since a temperature, water quality, pressure, and the like of water that is capable of being supplied vary depending on the factory, it is necessary to confirm whether or not cooling conditions of the tester 50 are met. Even in this case, since it is not necessary to provide the chiller unit dedicated to the tester, it is possible to reduce the footprint of the testing system, and to reduce the power for exchanging heat of the cooling water, for example.

Next, the shutter 25 used in the inspection chamber 21 of each level of each of the inspection modules 2 will be described.

In FIG. 2, the shutter 25 is drawn vertically but a plurality of inspection modules 2 are arranged and the inspection chambers 21 of each of the inspection modules 2 are provided in multiple levels. Thus, when the shutters 25 are provided vertically, interference between the shutters becomes a problem when the shutters are moved vertically so as to open and close the openings 24. In addition, when the shutters 25 are opened and closed in the horizontal direction, the arrangement of the inspection module 2 is restricted and the footprint of the testing system itself is increased. In the present embodiment, a shutter unit to be described below is provided so as to solve such a problem.

Figure 15:
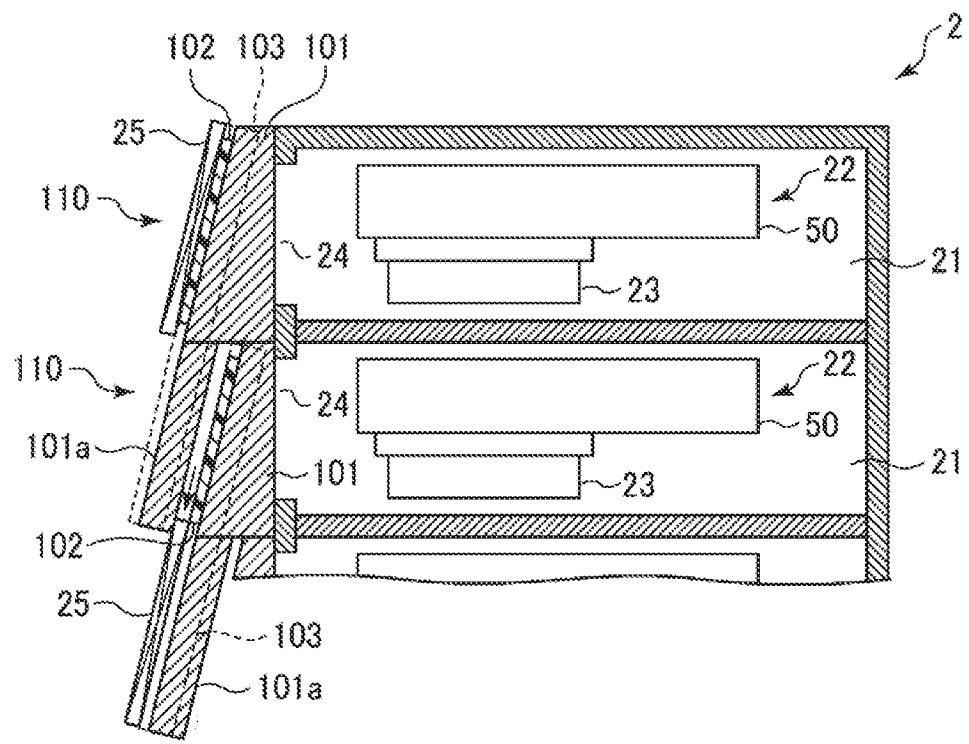
FIG. 15 is a cross-sectional view illustrating a configuration of a shutter unit including a shutter used in an inspection chamber.
Figure 16:
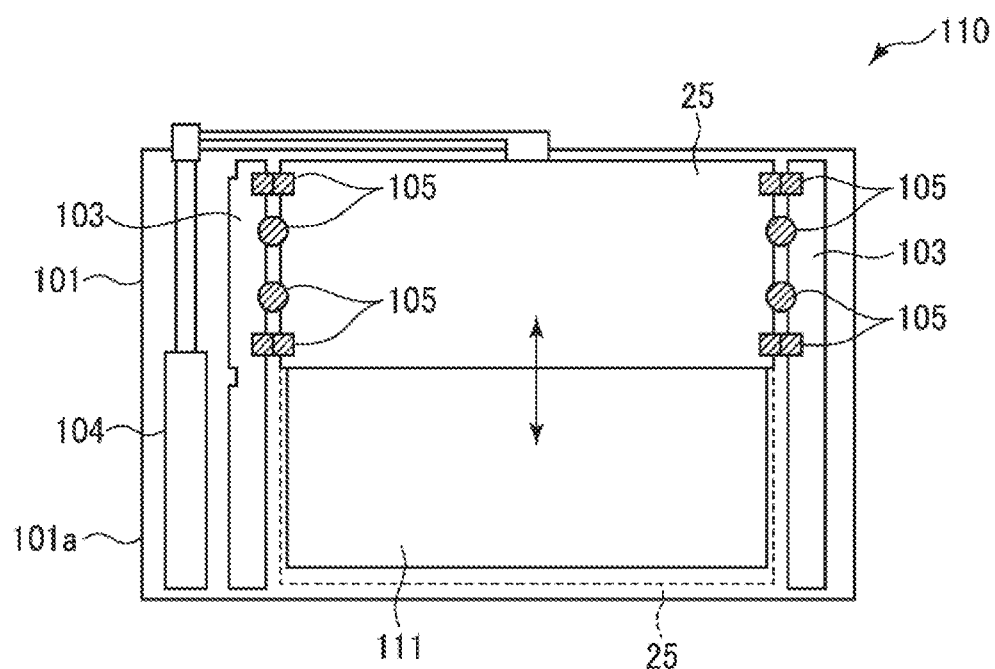
FIG. 16 is a front view illustrating a configuration of the shutter unit including the shutter used in the inspection chamber.
Figure 17:
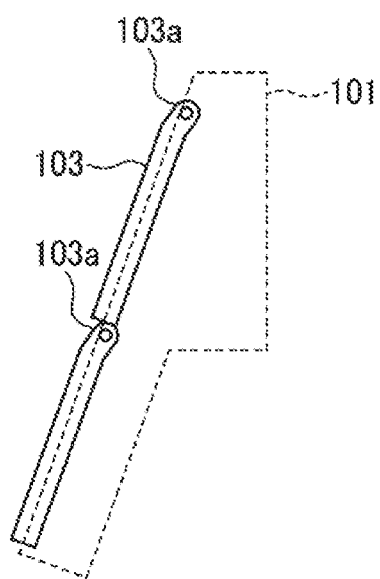
FIG. 17 is a view illustrating a configuration of a shutter guide of the shutter unit including the shutter used in the inspection chamber.

FIG. 15 is a cross-sectional view illustrating a structure of the shutter unit including the shutter 25 used in each of the inspection chambers 21, FIG. 16 is a front view thereof, and FIG. 17 is a view illustrating a configuration of a shutter guide.

As illustrated in FIGS. 15 and 16, a shutter unit 110 includes a base plate 101, the shutter 25, a packing 102, a guide member 103, and a cylinder mechanism 104. The base plate 101 is provided on a front surface of the inspection chamber 21. The shutter 25 moves on the base plate 101 to open and close the opening 24 in the front surface of the inspection chamber 21. The packing 102 hermetically seals the shutter 25. The guide member 103 is provided on the base member 101 and guides the shutter 25. The cylinder mechanism 104 moves the shutter 25 along the guide member 103.

A front surface of the base plate 101 is inclined from a vertical direction, and the shutter 25 is moved in an obliquely vertical direction along the front surface inclined from the vertical direction so as to open and close the opening 24 in the inspection chamber 21. The shutter 25 includes a plurality of cam followers 105 and is guided on the guide member 103 by the cam followers 105.

The base plate 101 has a retracting portion 101a extending to the front side of an inspection chamber 21 at a lower level of the corresponding inspection chamber 21, and when the shutter 25 is opened, the shutter 25 is retracted to the retracting portion 101a. An opening 111 is formed in the retracting portion 101a, and thus the carry-in/out of the tester part 22 and the chuck top 23 with respect to the inspection chamber 21 at the lower level is not hindered.

In this manner, by providing the base plate 101, the front surface of which is inclined from the vertical direction on the front surface of the inspection chamber 21, and making the shutter 25 move in the obliquely vertical direction along the front surface inclined from the vertical direction, following effects are obtained. That is, it is possible to secure a shutter space of the inspection chamber 21 at the lower level, and it is possible to prevent the interference of the shutters 25 even though the shutters 25 move in the vertical direction in a plurality of inspection chambers 21 stacked in multiple levels. For this reason, it is possible to solve the problems of restricting the arrangement of inspection modules 2 and increasing the footprint of the testing system itself.

As illustrated in in FIG. 17, a drop portion 103a having an angle is provided at an upper end of the guide member 103. Thereby, when the shutter 25 is closed, the cam followers 105 move to the drop portion 103a, and the shutter 25 is pressed against the base plate 101 so as to ensure airtightness. A middle portion of the guide member 103 is also provided with a drop portion 103a, and the cam followers 105 also move to the drop portion 103a when the shutter 25 is opened, so that the shutter 25 is positioned.

In the testing system 100 configured as described above, a wafer W before inspection is taken out from a FOUP 11 and transported to the pre-alignment part 5 by the loader 13, and pre-alignment is performed in the pre-alignment part 5. Thereafter, the wafer W of the pre-alignment part 5 is received by the transport mechanism 7, and the wafer W on the transport mechanism 7 is transported to the aligner module 6 in the alignment area 1. At this time, the chuck top 23 is mounted on the aligner 32 in the housing 31 of the aligner module 6, and the wafer W is transported onto the chuck top 23. The wafer W is vacuum-adsorbed on the chuck top 23.

Then, as described above, the corresponding tester part 22 moves from the inspection chamber 21 into the housing 31 of the aligner module 6, the aligner 32 is raised so as to bring the wafer W into contact with the contact probes of the probe card 52, and the chuck top 23 is adsorbed to the tester part 22 by evacuating the space surrounded by the bellows 54. Thereafter, the tester part 22 is returned to the inspection chamber 21 together with the chuck top 23 adsorbed thereto, and the electrical inspection of the wafer W (the devices) is started.

The transport operation of the wafer W as described above is performed on five levels per one inspection module 2 (a total of 30 inspection chambers for 6 inspection modules 2), and the inspection is sequentially carried out from the inspection chamber in which setting has been completed.

Then, as described above, with respect to the inspection chamber 21 in which the inspection has been completed, the tester part 22 therein is inserted into the housing 31 of the aligner module 6 together with the chuck top 23 adsorbed thereto, the chuck top 23 is separated from the tester part 22 while being mounted on the aligner 32, and the tester part 22 is returned to the inspection chamber 21. Then, the inspected wafer W on the chuck top 23 is received and transported to the buffer part 4 by the transport mechanism 7, and the wafer W in the buffer part 4 is returned to the FOUP 11 by the loader 13.

Next, through the procedure described, a wafer to be inspected W is transported onto the chuck top 23, which exists on the aligner 32 and from which the wafer W has been transported, the wafer 23 is mounted by causing the chuck top 23 to be adsorbed to the tester part 22 through the procedure described, the tester part 22 is returned to the inspection chamber 21 together with the chuck top 23, and the inspection of the next wafer W (the devices) is performed. Then, the above-described operations are repeated.

As described above, Patent Document 1 has proposed a testing system, in which a plurality of cells, each having a prober part and a test head accommodating a tester, are arranged in a horizontal direction and a height direction in order to perform an efficient electrical inspection on a plurality of wafers. However, more efficient inspection is required, and it is required to further increase the number of cells in order to increase the throughput. However, the technique of Patent Document 1 has a limit in view of a fact that there is a limit to a height of a clean room in which such the testing system is arranged and that it is necessary to suppress a footprint of the system in the clean room as much as possible.

In contrast, in the present embodiment, the inspection module 2 having the plurality of inspection chambers 21 (the testers) is located adjacent to the alignment area 1 in which the aligner module 6 is accommodated. Accordingly, it is possible to arrange the plurality of inspection modules 2, in each of which inspection chambers 21 are stacked in multiple levels, around the alignment area 1. For this reason, it is possible to increase a mounting density of the testers. Accordingly, it is possible to increase the number of the testers for the footprint of the apparatus compared with the conventional case, and to perform more efficient inspection with the higher throughput.

In the present embodiment, since the tester part 22 is carried into the alignment area 1 and an alignment of a wafer by the aligner 32 is performed in the alignment area 1, an alignment of a wafer by the aligner at a position below the tester, which has been performed in the prior art, is not necessary. For this reason, it is possible to increase the number of stacked levels of the inspection chambers 21 (the testers) compared with the conventional case, and it is possible to further increase the mounting density of the testers.

In the present embodiment, since the plurality of inspection modules 2 are arranged radially around the alignment area 1 in a cluster shape, it is possible to shorten transport distance of a wafer W between a FOUP 11, which is a wafer accommodation container, and the inspection chamber 21, and it is also possible to increase the throughput from this point.

When the inspection is performed in a state in which the chuck top 23 is at the low temperature by the chiller from the chiller unit 27, the inspection part 200 is in a dry atmosphere, so that it is possible to prevent an occurrence of dew condensation.

In addition, with the following (1) to (3), it is possible to surely prevent air from infiltrating into the alignment area 1 and the inspection chambers 21.

(1) In the loader part 300, the transport part 3, the buffer part 4, and the pre-alignment part 5 which are interfaces with the inspection part 200 are also in a dry atmosphere.

(2) 'The buffer part 4 and the pre-alignment part 5' and the ambient air atmosphere are partitioned by the shutters 43 and 44.

(3) The shutter 42 is provided between the transport part 3 and the alignment area 1.

Furthermore, since the shutter 25 is provided in each of the inspection chambers 21, it is possible to ensure that an inside of each of the inspection chambers 21 is individually or integrally brought into a desired dry atmosphere. In addition, when maintenance of the inspection chamber 21 is performed, it is possible to prevent air from infiltrating into the alignment area 1 from the inspection chamber 21 which is being maintained.

In addition, since the aligner module 6 is configured to align the chuck top 23 and a wafer W with the tester part 22 in the housing 31, to which the downflow of dry air from the FFU 33 is supplied, it is possible to reliably prevent an influence of dew condensation during the alignment. In addition, since the shutters 38 and 39 are provided in the opening 36 for transporting a wafer in the housing 31 and the opening 37 for transporting the tester part 22 and the chuck top, it is possible to more reliably prevent the influence of dew condensation during the alignment. Further, when a wafer W is pressed against the contact probes of the probe card 52, the housing 31 is capable of supporting the tester 22 via a predetermined member, so that it is possible to prevent a pressing force on the wafer W from being relieved.

In addition, in the present embodiment, since the tester 50 (the tester part 22) that needs to be cooled moves between the inspection chamber 21 and the aligner module 6, if cooling water is supplied directly through the cooling water tube, the disposition of the tube is complicated. In contrast, in the examples of FIGS. 10 and 11A, it is possible to prevent the above-mentioned problems since the cooling member 61 and the cooling water supply part 70 are provided on a rear surface of the tester 50 in the inspection chamber 21 so as to be configured to be brought into contact with and be separate from each other. That is, during the inspection where a necessity for cooling is high, it is possible to ensure cooling by causing the cooling member 61 and the cooling water supply part 70 to come into contact with or to be connected to the tester 50, and by causing heat transfer or cooling water to directly flow. During maintenance where the necessity for cooling is relatively low, it is possible to ensure a required cooling by separating the tester 50 from the cooling member 61 or the cooling water supply part 70 and by circulating the cooling water in the tester 50. For this reason, the complicated disposition of the cooling water tube becomes unnecessary.

In the present embodiment, since the chiller area 8 is provided below the inspection part 200, the chiller area does not increase the footprint.

Second Embodiment

Next, a second embodiment will be described.

Figure 18:
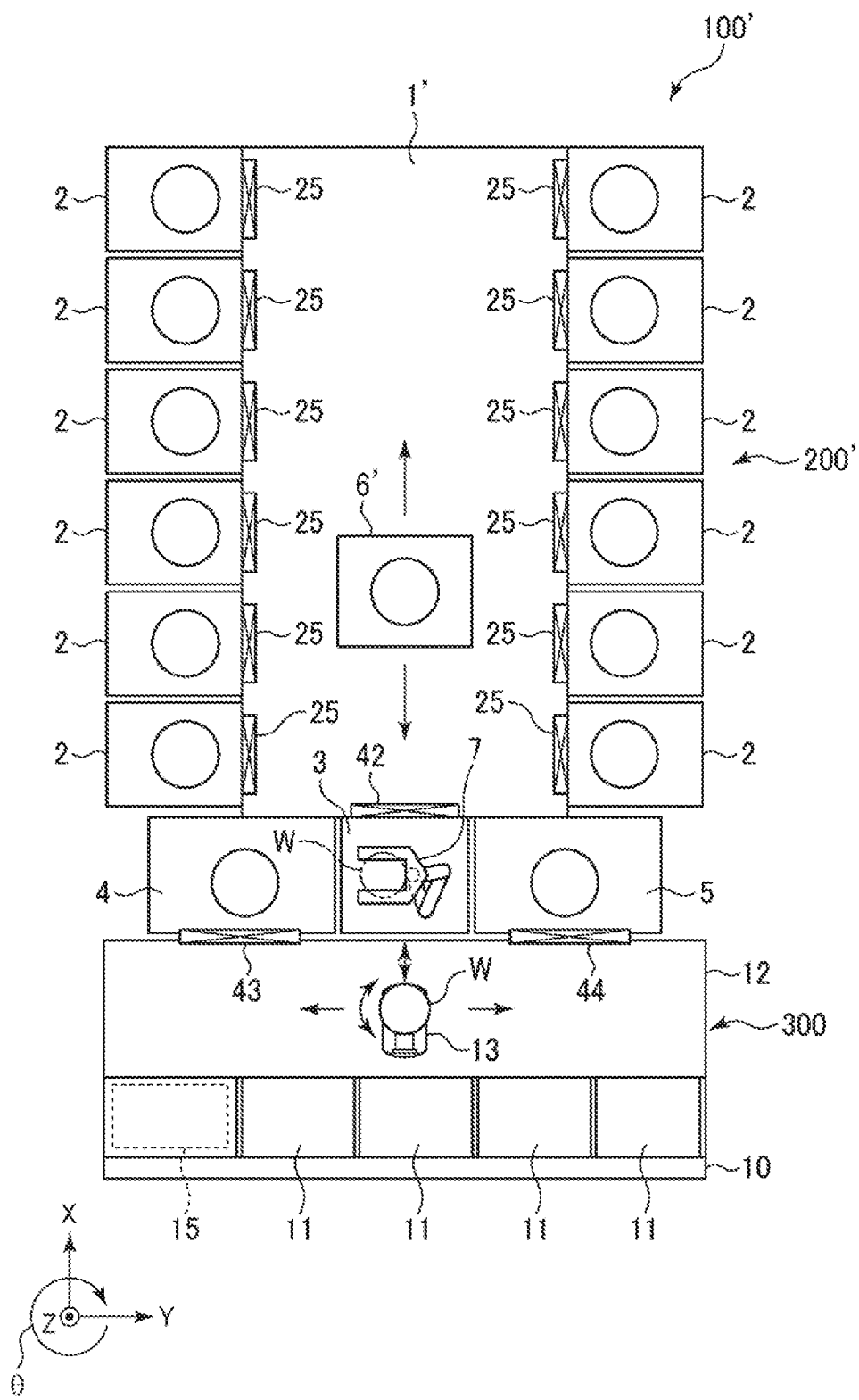
FIG. 18 is a plan view illustrating the schematic configuration of a testing system according to a second embodiment.

FIG. 18 is a plan view illustrating a schematic configuration of a testing system according to the second embodiment. In the present embodiment, the same components as those in FIG. 1 will be denoted by the same reference numerals and a description thereof will be omitted.

The testing system 100' of the present embodiment includes an inspection part 200' and a loader part 300 similar to that of the first embodiment. In the present embodiment, the inspection part 200' has a long rectangular parallelepiped alignment area 1' extending in an X direction orthogonal to a Y direction in which the loader 13 of the loader part 300 moves, and a plurality of inspection modules 2 are provided along both sides in a longitudinal direction thereof. In the present example, a total of 12 inspection modules (6 inspection modules for each side) are provided. As in the first embodiment, the inspection module 2 has five levels of the inspection chambers 21 and a total of 60 inspection chambers 21.

The aligner module 6' in the alignment area 1' has the same basic configuration as the aligner module 6 of the first embodiment, but is different from the aligner module 6 in that the aligner module 6' is capable of traveling in the X direction in addition to moving up and down and rotating. For example, the transport of a wafer W, the alignment of the chuck top 23, and the alignment between the tester part 22 and a wafer W may be performed as in the first embodiment.

In the present embodiment, since the aligner module 6' moves in the X direction, the throughput may be affected by a moving time of the aligner module 6'. However, it is possible to remarkably increase the number of inspection chambers (the testers) for the footprint, and to further increase the mounting density of the testers.

Third Embodiment

Next, a third embodiment will be described.

Figure 19:
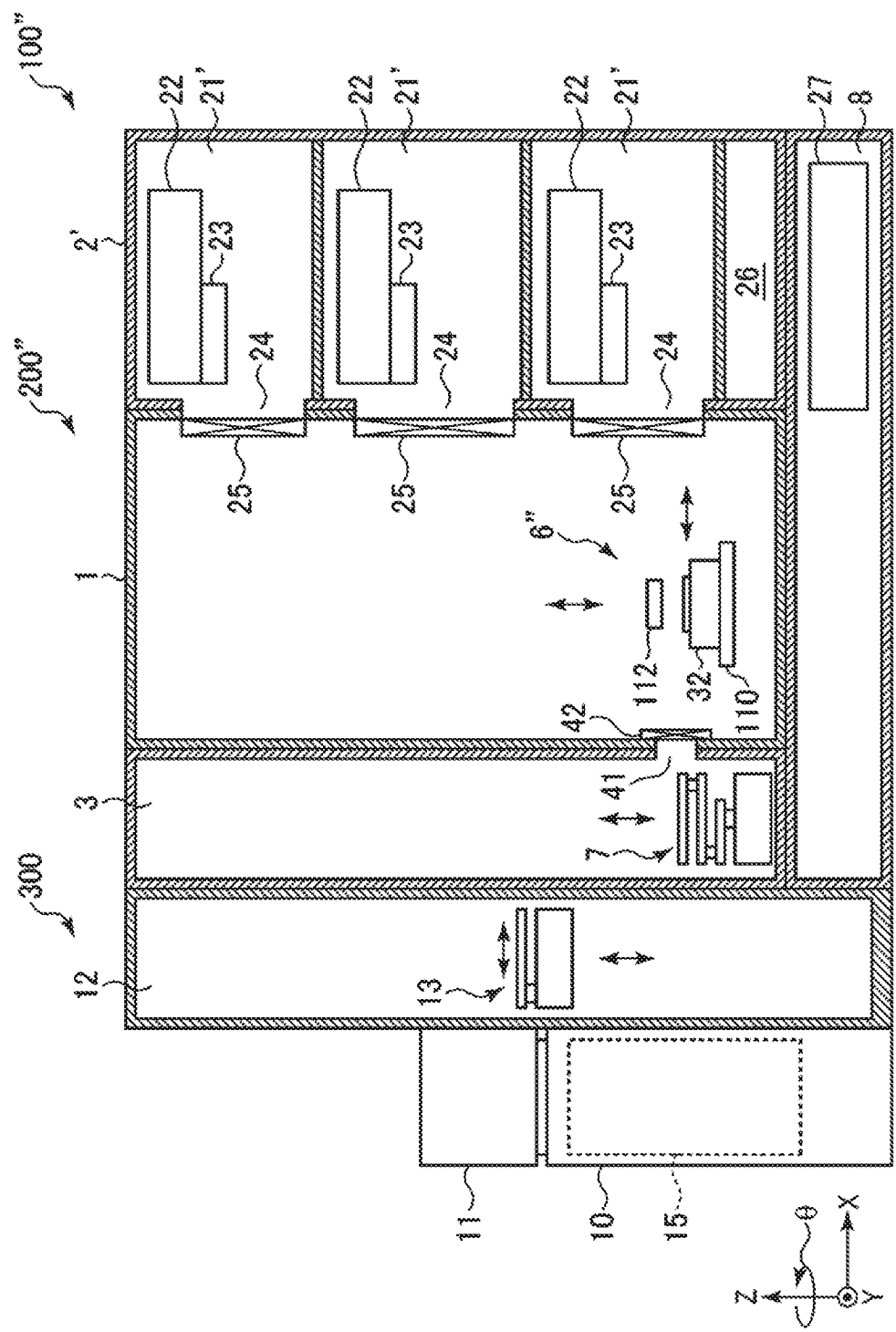
FIG. 19 is a vertical cross-sectional view illustrating the schematic configuration of a testing system according to a third embodiment.

FIG. 19 is a vertical cross-sectional view illustrating a schematic configuration of a testing system according to the third embodiment. In the present embodiment, the configuration of the testing system is similar to that of the first embodiment, but a configuration of the aligner module is different from that of the first embodiment, and an alignment position is also different from that of the first embodiment. In the present embodiment, the same components as those in FIG. 2 will be denoted by the same reference numerals and a description thereof will be omitted.

The testing system 100" of present embodiment includes an inspection part 200" and a loader part 300 similar to that of the first embodiment. In the present embodiment, the inspection part 200" includes an aligner module 6", an alignment area 1, and a plurality of (in the present example, six) inspection modules 2'. The aligner module 6" is for performing the alignment between a wafer and the tester, and is accommodated in the alignment area 1. As in the first embodiment, the alignment area 1 has a polygonal shape in a plan view, and the plurality of inspection modules 2' are radially provided around the alignment area 1 so as to have a cluster shape.

Each of the inspection modules 2' has a plurality of (in the present example, three) levels of inspection chambers 21'. Unlike the inspection chambers 21 of the first embodiment, each of the inspection chambers 21' has an alignment area formed below the tester part 22.

The aligner module 6" has a base 110, an aligner 32 supported on the base 110, and an alignment camera 112 configured to capture an image in a vertical direction. Like an AGV, the aligner module 6" is capable of being self-propelled in the vertical direction and horizontal direction in the alignment area 1 and in a space below the tester part 22 in each of the inspection chambers 21'. During the alignment, the aligner module 6" is adapted to enter the area below the tester part 22 of the inspection chamber 21'.

When a wafer W is transported to the tester part 22, the aligner module 6" enters the area below the tester part 22 in the inspection chamber 21' and the chuck top 23 is placed on the aligner 32, and the aligner module 6" is returned to the alignment area 1. In the alignment area 1, a wafer W transported from the front opening 41 by the transport mechanism 7 is placed on the chuck top 23 held by the aligner 32 and adsorbed. Then, the aligner module 6" is carried into the inspection chamber 21' together with the chuck top 23 on which the wafer W is adsorbed, and the alignment is performed.

Figure 20:
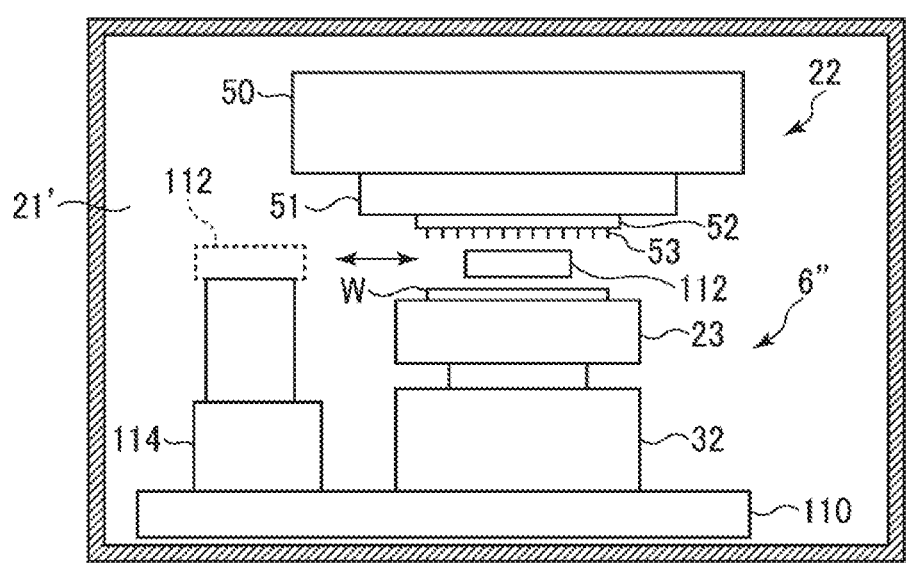
FIG. 20 is a cross-sectional view illustrating a state during alignment in the testing system according to the third embodiment.

A state when the alignment is performed will be described with reference to FIG. 20. FIG. 20 is a cross-sectional view illustrating the inspection chamber 21' of FIG. 19, in which a cross section in a direction orthogonal to FIG. 19 is illustrated. On the base 110, an alignment mechanism 114 for the alignment camera 112 is provided in addition to the aligner 32. The alignment mechanism 114 is capable of driving the alignment camera 112 in the X, Y, and Z directions, and when the alignment camera 112 is at a home position indicated by the dotted line, adjustment of the optical axis deviation and adjustment of the focus position are performed. As illustrated in FIG. 20, the alignment camera 112 is configured to be movable from the home position to an arbitrary position between the probe card 52 and a wafer W.

When the alignment in the state of FIG. 20 is performed, coordinates of a predetermined electrode pad of a wafer W are checked by capturing an image of the wafer W using the alignment camera 112, and coordinates of the corresponding contact probes are checked by capturing an image of the probe card 52. Then, a coordinate difference between the electrode pad and the contact probe is calculated. Such an operation is further performed with respect to, for example, coordinates of three positions of the electrode pad and the contact probe, and the coordinate differences between the electrode pad and the contact probe are calculated. Contact coordinates are determined by an average of the coordinate differences.

By using the alignment camera 112 of the present embodiment, it is not necessary to perform the alignment by stroke of the aligner 32, making it possible to reduce a size of the aligner module 6" (the aligner 32). Accordingly, the movement of the above-described aligner module 6" within the alignment area 1 and the movement of the aligner module 6" entering the area below the tester part 22 of the inspection chamber 21' are enabled.

In the present embodiment, a case where the testing system has a basic configuration as in the first embodiment has been described, but the description is also applicable to a case where the basic configuration is configured as in the second embodiment.

<Other Applications>

Although embodiments have been described above, it should be considered that the embodiments disclosed herein are examples and are not restrictive in all respects. The above-described embodiments may be omitted, replaced, or modified in various forms without departing from the scope and spirit of the appended claims.

For example, in the above-described embodiments, an inspection apparatus capable of inspecting at a low temperature by providing the chiller unit has been illustrated, but an apparatus for the inspection at a high temperature may be used. In that case, the chiller area is not necessary, it is possible to further increase the number of levels of the inspection chambers (the testers) of the inspection module. Further, there is no need to provide the shutter.

In the above-described embodiments, in order to prevent the dew condensation when cooling by the chiller, the inspection part is adjusted to the dry atmosphere compared to the loader part in the ambient air atmosphere, but for other purposes, the atmosphere of the inspection part may be in other environments suitable for the inspection (e.g., a reduced pressure atmosphere or other gas atmospheres). As described above, in order to maintain the inspection part in an environment different from the ambient air atmosphere, the shutter is required as in the above-described embodiments.

In addition, although the aligner module 6 has a configuration in which the aligner is provided within the housing, the housing is not necessarily used.

Furthermore, the arrangements of the inspection modules in the first embodiment and the second embodiment are merely examples, and any configuration may be used as long as the inspection modules are arranged around the alignment area. The number of inspection modules and the number of levels of the inspection modules (the testers) are also arbitrary. However, in order to ensure a superiority over the prior art, the number of levels of the inspection chambers (the testers) is preferably four or more.

EXPLANATION OF REFERENCE NUMERALS 1, 1': alignment area, 2, 2': inspection module, 3: transport part, 6, 6', 6": aligner module, 15: controller, 21, 21': inspection chamber, 22: tester part, 23: chuck top, 32: aligner, 34: upper camera, 35: lower camera, 50: tester, 51: interface part, 52: probe card, 53: contact probe, 100, 100', 100": testing system, 200, 200', 200": inspection part, 300: loader part, W: wafer (inspection object)

What is claimed is:

1. A testing system comprising:
   an inspection module including a plurality of levels of inspection chambers in each of which a tester part having a tester configured to perform an electrical inspection of an inspection object and a probe card is accommodated;
   an aligner module configured to align the inspection object with the tester part;
   an alignment area in which the aligner module is accommodated; and
   a loader part configured to load the inspection object into the aligner module and unload the inspection object out of the aligner module,
   wherein the inspection module is located adjacent to the alignment area,
   wherein at least the alignment area and the inspection chambers are maintained in a predetermined atmosphere, and
   wherein a shutter is provided between each of the inspection chambers and the alignment area.

2. The testing system of claim 1, wherein the aligner module is configured to move up and down, and rotate around a vertical axis.

3. The testing system of claim 1, wherein the aligner module includes an aligner, and the aligner is connected to a chuck top on which the inspection object is placed.

4. The testing system of claim 3, wherein the aligner module includes a housing accommodating the aligner and configured to move up and down and rotate around a vertical axis.

5. The testing system of claim 4, further comprising a fan filter unit provided on an upper surface of the housing and configured to form a downflow of clean gas.

6. The testing system of claim 3, wherein, when the inspection object is mounted on the tester part, the tester part located in a predetermined inspection chamber of the inspection chambers is moved from the predetermined inspection chamber to an upper side of the aligner, the aligner raises the chuck top so as to adsorb the chuck top to the tester part in a state in which the inspection object is in contact with a contact probe of the probe card, and the tester part is moved to the inspection chamber together with the chuck top in the state.

7. The testing system of claim 1, wherein the loader part comprises:
   a loader module including a loader configured to load the inspection object into an inspection object accommodation container and unload the inspection object out of the inspection object accommodation container; and
   a transport area configured to transport the inspection object unloaded from the loader module to the alignment area,
   wherein the transport area is maintained in the predetermined atmosphere, and
   a shutter is provided between the transport area and the alignment area.

8. The testing system of claim 7, wherein the loader is configured to move up and down between a position at which the inspection object is delivered to the inspection object accommodation container and a position at which the inspection object is delivered to the transport area.

9. The testing system of claim 7, wherein the transport area comprises:
   a buffer part in which the inspection object is temporarily disposed,
   a pre-alignment part configured to perform pre-alignment of the inspection object, and
   a transport part having a transport mechanism configured to transport the inspection object between the buffer part, the pre-alignment part and the aligner module,
   wherein the inspection object is delivered from the loader to the buffer part and the pre-alignment part,
   the shutter is provided between the transport part and the alignment area, a shutter is provided between the loader module and the buffer part, and a shutter is provided between the loader module and the pre-alignment part.

10. The testing system of claim 9, wherein the transport mechanism is configured to move up and down between the buffer part, the pre-alignment part and a delivery part of the aligner module.

11. The testing system of claim 1, wherein the inspection chambers are independently or integrally controlled to the predetermined atmosphere.

12. The testing system of claim 1, further comprising a base plate located on an alignment area side of the inspection chamber and having a front surface inclined from a vertical direction,
   wherein the shutter moves obliquely up and down along the front surface inclined from the vertical direction and opens/closes an alignment area-side opening in the inspection chamber.

13. The testing system of claim 12, wherein the base plate is provided with a guide member configured to guide the shutter,
   the shutter includes a plurality of cam followers so as to be guided to the guide member by the cam followers, and
   the guide member includes a drop portion having an angle so as to cause the shutter to be pressed against the base plate when the shutter is closed.

14. The testing system of claim 1, wherein the shutter is closed for at least one inspection chamber among the plurality of inspection chambers, in which maintenance is performed.

15. The testing system of claim 1, wherein the inspection is performed at low temperature, and
the predetermined atmosphere is a dry atmosphere.

16. The testing system of claim 1, further comprising a cooling mechanism configured to cool the tester.

17. The testing system of claim 16, wherein the cooling mechanism comprises a cooling liquid tube configured to supply a cooling liquid into the tester, and
the cooling liquid tube is accommodated in an articulated cable duct together with a vacuum line and a feeding cable.

18. The testing system of claim 16, wherein the cooling mechanism cools the tester by circulating and supplying factory water of a factory in which the testing system is installed.

19. The testing system of claim 1, wherein a plurality of inspection modules each of which is the inspection module are provided radially around the alignment area.

20. The testing system of claim 1, wherein the alignment area has a long rectangular shape,
a plurality of inspection modules each of which is the inspection module are arranged along both sides in a longitudinal direction of the alignment area, and
the aligner module is configured to move in the longitudinal direction of the alignment area.

* * * * *